US006762457B2

(12) United States Patent
Pearce et al.

(10) Patent No.: US 6,762,457 B2
(45) Date of Patent: Jul. 13, 2004

(54) LDMOS DEVICE HAVING A TAPERED OXIDE

(75) Inventors: Charles Walter Pearce, Emmaus, PA (US); Muhammed Ayman Shibib, Wyomissing, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/300,254

(22) Filed: Nov. 20, 2002

(65) Prior Publication Data

US 2003/0100165 A1 May 29, 2003

Related U.S. Application Data

(62) Division of application No. 09/641,086, filed on Aug. 17, 2000, now Pat. No. 6,506,641.

(51) Int. Cl.[7] ............................ H01L 29/76; H01L 29/94
(52) U.S. Cl. ........................................ 257/343; 257/409
(58) Field of Search ................................. 257/335, 343, 257/409; 438/225, 265, 297, 410, 439, 448, 701, FOR 229

(56) References Cited

U.S. PATENT DOCUMENTS

| 5,378,912 A | * | 1/1995 | Pein | 257/335 |
| 5,777,363 A | * | 7/1998 | Malhi | 257/343 |
| 5,783,474 A |   | 7/1998 | Ajit |  |
| 6,046,474 A | * | 4/2000 | Oh et al. | 257/343 |

FOREIGN PATENT DOCUMENTS

JP 2-283072 * 11/1990 ................ 257/343

OTHER PUBLICATIONS

"Silicon Processing for the VLSI Era, vol. 3—The Submicron MOSFET" by Wolf, 1995, pp. 330–331.*

* cited by examiner

Primary Examiner—Steven Loke

(57) ABSTRACT

The invention includes a laterally diffused metal oxide semiconductor transistor comprising a gate electrode and comprising tapered oxide self aligned to the gate electrode.

8 Claims, 1 Drawing Sheet

LDMOS DEVICE HAVING A TAPERED OXIDE

This Application is a Divisional of prior application Ser. No. 09/641,086 filed on Aug. 17, 2000, now U.S. Pat. No. 6,506,641, to Charles W. Pearce. The above-listed Application is commonly assigned with the present invention and is incorporated herein by reference as if reproduced herein in its entirety under Rule 1.53(b).

FIELD OF THE INVENTION

This invention relates to laterally diffused metal oxide semiconductor (LDMOS) transistors.

BACKGROUND OF THE INVENTION

Lateral Diffused Metal Oxide Semiconductor devices (LDMOS) are employed in various power control and amplifier applications. In the latter use, the operation is often constrained in frequency by the gate to drain overlap capacitance as well as reliability issues that relate to the electric field in the vicinity of the drain and its effect on "hot carrier aging." Past attempts to minimize these problems deviate from using a gate oxide of uniform thickness by placing one edge of the gate over a region of thicker oxide (thicker than gate oxide) as shown in prior art FIGS. 1 and 2. Presently, this thicker oxide is grown first and the gate is then aligned to the thicker oxide. This results in uncertain device characteristics due to the vagaries of the alignment and shape of the transition region between the thick and thin oxide regions.

There are several disadvantages to using a uniform gate oxide thickness and the prior art structures of FIGS. 1 & 2:

A. With a uniform gate oxide, the gate to drain (N-region) overlap capacitance is large, which limits the frequency response of the LDMOS.

B. The abrupt transition from the gate-to-N-region oxide transition is significant, which results in a high electric field and, thus, undesirable hot carrier generation and possibly low breakdown voltage.

The gate oxide thickness significantly determines the threshold voltage of the device and the maximum gate voltage, so increasing the gate oxide thickness to improve (A) and (B) above result in a high threshold voltage, $V_{TH}$, and a low transconductance.

SUMMARY OF THE INVENTION

The invention includes a laterally diffused metal oxide semiconductor transistor comprising a gate electrode and comprising tapered oxide self aligned to the gate electrode and a method of making the transistor.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The invention includes a selective oxidation that self-aligns a thick, tapered oxide region to a gate electrode edge. In one embodiment, a nitride layer is placed over the entire wafer and an opening is patterned and subsequently etched into the nitride. One side of the opening is placed over the gate electrode and the other is placed some distance W away. The wafer is then oxidized to grow a thicker, tapered (or graded) oxide under the gate electrode. The nitride layer is then removed conventionally, such as with a phosphoric acid etch. The thicker, tapered oxide is the result of oxidation of both the polysilicon gate and the substrate silicon.

Thus, to optimize the characteristics of the RF-LDMOS of the present invention, an asymmetric graded (or tapered) gate oxide is desired such that the oxide thickness is greater on the drain side of the gate than in the channel region next to the source.

Figure 1:
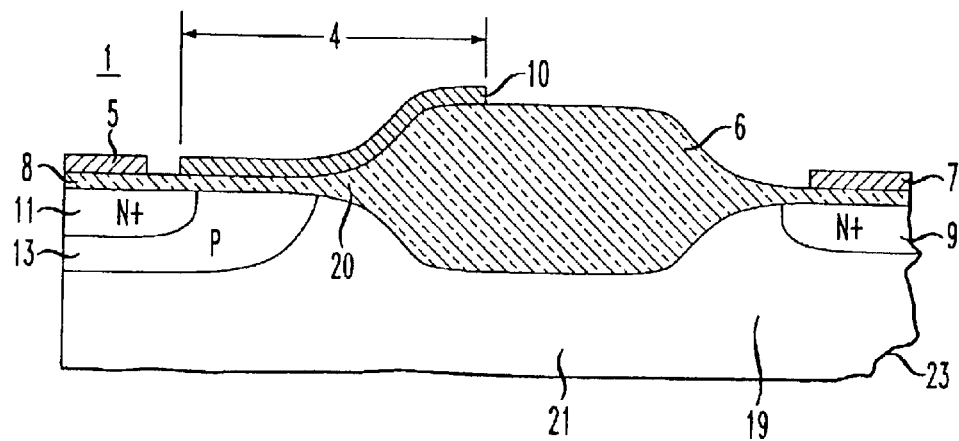
FIG. 1 is a cross-sectional view of a prior art LDMOS showing an edge of the gate electrode over a gate oxide containing a step.

Referring now to the drawing, wherein like reference numerals refer to like elements throughout, FIG. 1 is a cross-sectional view of a prior art LDMOS device 1. Device 1 deviates-from using a gate oxide 8 of uniform thickness by placing one edge of the gate 10, of gate width 4, over a region of thicker oxide (thicker than gate oxide), the field oxide 6. Also shown are the source 5, the drain 7, $N^+$ regions 9 and 11, P region 13 and an N-well drift region 19 in a substrate 23.

Note that gate width 4 is typically greater than 1 to 1.5 microns and the channel region is large because of the misalignment tolerance between the gate electrode 10 and the transition region between the thin gate oxide 2 and the thick field oxide 6. Also, the gate-drain overlap capacitance is large because of the deleterious existence of a region of gate oxide 20 above the N-well drift region 19 near drain 7 and the region of gate electrode 10 above the thick field oxide 6, thus limiting the high frequency performance of the device. This compromises the speed of the device so that it operates at less than 1 GHz.

Figure 2:
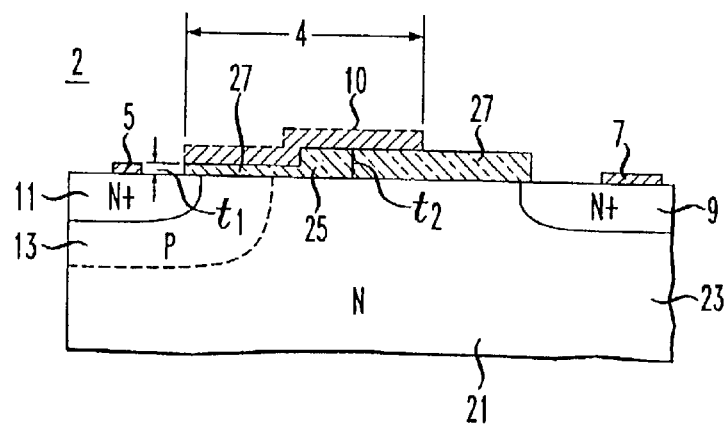
FIG. 2 is a cross-sectional view of a prior art LDMOS showing an edge of the gate electrode over two gate oxide thicknesses $t_1$ and $t_2$ where $t_2 \leq 2t_1$ (typically).

FIG. 2 is a cross-sectional view of yet another prior art LDMOS device 2. In device 2, a gate oxide 25 is provided that has a step in thickness, $t_1$ 27 and t2 29.

The gate-drain overlap capacitance is large in device 2 because $t_2$ of oxide 27 is approximately equal to $2t_1$ of oxide 29, again limiting the high frequency performance of the device to less than 1 GHz.

Figure 3:
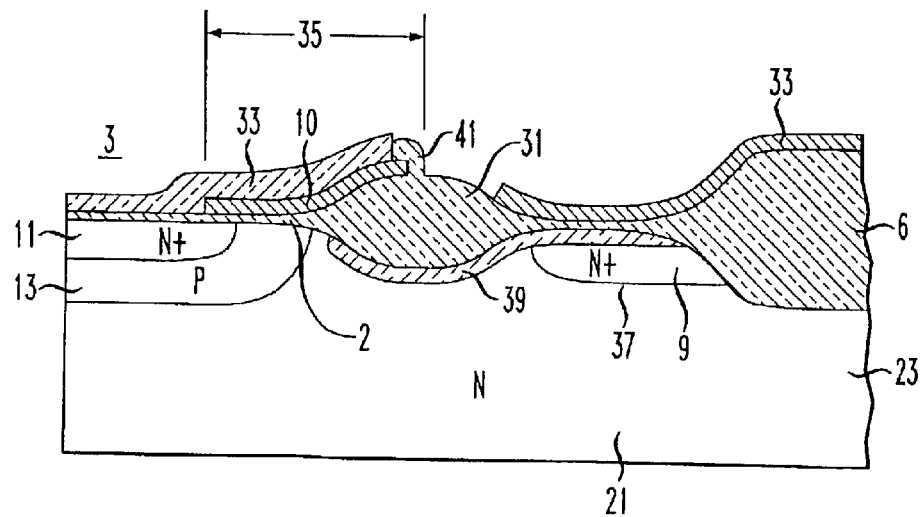
FIG. 3 is a cross-sectional view of an LDMOS showing the edge of the gate electrode over a tapered oxide, for one embodiment of the invention.

In contrast to the prior art of FIGS. 1 and 2, FIG. 3 shows an exemplary device 3 having a tapered oxide 31 as part of the gate oxide 8, distinct from the field oxide 6, for one embodiment of the invention. The taper oxide 31 is grown after the gate electrode 10 is deposited, the gate electrode 10 is preferably made of doped polysilicon. The tapered oxide 31 is formed by depositing a mask 33, such as silicon nitride, and patterning an opening in the mask adjacent to the gate electrode 10. The mask 33 is patterned such that one side of the opening is placed over the gate electrode 10 and the other side of the opening is placed some distance away from the gate electrode 10. In a preferred embodiment, the polysilicon gate electrode 10 is aligned to the existing field (LOCOS or isolation) oxide 6.

The tapered (or graded) oxide 31 is then grown by thermal oxidation or oxygen implant, for example. In a preferred embodiment, the mask 33 is then removed. The tapered oxide 31 is distinct from the field oxide 6 and is less than about 500 nm thick at its thickest point. 200 to 250 nm is preferred. The field oxide 6 of the prior art would typically be greater than 500 nm at its thickest point.

The structure of FIG. 3 can typically have a gate width 35 less than 1 micron. The structure can easily be realized with a gate width 35 equal to 0.3 micron and even less. The device 3 has an $f_T$ (unity gain frequency) above 10 GHz.

The LDMOS structure of FIG. 3 reduces the disadvantages of the prior art without negatively affecting the threshold voltage or transconductance of the LDMOS. Note that the gate width 35 could be adjusted to control the electric field at high drain-source voltage near the N-N.sup.+ transition 37, which maybe the region where breakdown occurs. In a preferred embodiment, a device of the present invention will also comprise an N lightly dope drain (LDD) 39. Note that FIG. 3 shows oxide 31 (silicon dioxide) on the side of the polysilicon gate, which does not occur when the field oxide is grown before gate electrode deposition, as in the prior art. What results is a transistor capable of operating in the region of 1 to 10 GHz.

An alternative embodiment (not shown) is to deposit a gate electrode, deposit a hardmask, such as silicon nitride, and pattern the hardmask to provide an opening in the mask adjacent to the gate electrode such that one side of the opening is placed over the gate electrode and the other side of the opening is placed some distance away from the gate electrode. Tapered oxide is then grown simultaneously with field oxide growth. Alternatively, the tapered oxide may itself be used to perform the function, device isolation, of the field oxide. Although the invention has been described with reference to illustrative embodiments, it is not limited to those embodiments. Rather, the appended claims should be construed to include other variants and embodiments of the invention that may be made by those skilled in the art without departing from the true spirit and scope of the present invention.

What is claimed is:

1. A laterally diffused metal oxide semilconductor transistor comprising a gate electrode and comprising tapered oxide self aligned to the gate electrode, wherein the tapered oxide has a thickness of less than 500 nm at the tapered oxide's thickest point, and wherein the tapered oxide is not a field oxide.

2. The transistor of claim 1, wherein the tapered oxide thickness ranges from 200 nm to 500 nm at the tapered oxide's thickest point.

3. The transistor of claim 1, wherein the tapered oxide thickness ranges from 200 nm to 250 nm at the tapered oxide's thickest point.

4. The transistor of claim 1, wherein the gate electrode is less than 1 micron wide.

5. The transistor of claim 1, wherein the gate electrode is 0.3 to less than 1 micron wide.

6. The transistor of claim 1, wherein the transistor is capable of operating in the region of 1 to 10 GHz.

7. A laterally diffused metal oxide semiconductor transistor comprising a gate electrode and having a tapered oxide self aligned to the gate electrode, wherein the tapered oxide is not a field oxide and has a thickness of less than 500 nm at the tapered oxide's thickest point, and wherein the transistor is capable of operating in the region of 1 to 10 GHz.

8. A laterally diffused metal oxide semiconductor transistor comprising a polysilicon gate electrode having a tapered silicon dioxide on at least one side of the gate electrode, wherein the silicon dioxide has a thickness of less than 500 nm at the silicon dioxide's thickest point, and wherein the tapered silicon dioxide is not a field oxide.

* * * * *